(12) United States Patent
Basler et al.

(10) Patent No.: US 11,437,470 B2
(45) Date of Patent: Sep. 6, 2022

(54) SILICON CARBIDE SEMICONDUCTOR COMPONENT

(71) Applicant: Infineon Technologies AG, Neubiberg (DE)

(72) Inventors: Thomas Basler, Ottenhofen (DE);
Rudolf Elpelt, Erlangen (DE);
Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 48 days.

(21) Appl. No.: 16/415,365

(22) Filed: May 17, 2019

(65) Prior Publication Data

US 2019/0355815 A1 Nov. 21, 2019

(30) Foreign Application Priority Data

May 18, 2018 (DE) .......................... 102018112109.1

(51) Int. Cl.
*H01L 29/06* (2006.01)
*H01L 29/16* (2006.01)
*H01L 29/872* (2006.01)
*H01L 29/78* (2006.01)
*H01L 29/04* (2006.01)
*H01L 29/80* (2006.01)

(52) U.S. Cl.
CPC ...... *H01L 29/0684* (2013.01); *H01L 29/1608* (2013.01); *H01L 29/045* (2013.01); *H01L 29/7802* (2013.01); *H01L 29/7813* (2013.01); *H01L 29/80* (2013.01); *H01L 29/872* (2013.01)

(58) Field of Classification Search
CPC H01L 29/1608; H01L 29/0684; H01L 29/872
See application file for complete search history.

(56) References Cited

U.S. PATENT DOCUMENTS

| | | | | |
|---|---|---|---|---|
| 5,061,972 A | * | 10/1991 | Edmond | ............... H01L 29/861 257/77 |
| 5,218,226 A | * | 6/1993 | Slatter | ................. H01L 29/0619 257/239 |
| 6,091,108 A | * | 7/2000 | Harris | ................. H01L 29/0623 257/339 |

(Continued)

FOREIGN PATENT DOCUMENTS

| | | |
|---|---|---|
| DE | 69011809 T2 | 3/1995 |
| DE | 10220359 A1 | 11/2002 |

(Continued)

*Primary Examiner* — Peter M Albrecht
(74) *Attorney, Agent, or Firm* — Murphy, Bilak & Homiller, PLLC

(57) ABSTRACT

The disclosure relates to a semiconductor component having an SiC semiconductor body and a first load terminal on a first surface of the SiC semiconductor body. A second load terminal is formed on a second surface of the SiC semiconductor body opposite the first surface. The semiconductor component has a drift zone of a first conductivity type in the SiC semiconductor body and a first semiconductor area of a second conductivity type which is electrically connected to the first load terminal. A pn junction between the drift zone and the first semiconductor area defines a voltage blocking strength of the semiconductor component.

20 Claims, 7 Drawing Sheets

(56) References Cited

U.S. PATENT DOCUMENTS

| | | | |
|---|---|---|---|
| 6,380,569 B1* | 4/2002 | Chang | H01L 29/0623 257/107 |
| 6,847,091 B2* | 1/2005 | Deboy | H01L 29/0634 257/495 |
| 9,704,949 B1* | 7/2017 | Ghandi | H01L 29/872 |
| 2007/0278472 A1* | 12/2007 | Mauder | H01L 29/861 257/11 |
| 2009/0140290 A1* | 6/2009 | Schulze | H01L 27/0255 257/162 |
| 2009/0267200 A1* | 10/2009 | Gutt | H01L 29/0615 257/655 |
| 2014/0027784 A1* | 1/2014 | Wada | H01L 29/0623 257/77 |
| 2014/0209973 A1* | 7/2014 | Laven | H01L 29/66348 257/155 |
| 2014/0231904 A1* | 8/2014 | Willmeroth | H01L 21/265 257/330 |
| 2015/0144965 A1* | 5/2015 | Tsuji | H01L 29/1608 257/77 |
| 2015/0206983 A1* | 7/2015 | Felsl | H01L 29/0603 257/618 |
| 2015/0214347 A1* | 7/2015 | Falck | H01L 21/265 257/139 |
| 2015/0364584 A1* | 12/2015 | Ryu | H01L 29/36 257/139 |
| 2016/0093690 A1* | 3/2016 | Falck | H01L 29/66136 257/139 |
| 2016/0380059 A1* | 12/2016 | Losee | H01L 29/6606 257/77 |
| 2018/0261666 A1* | 9/2018 | Zeng | H01L 29/7802 |
| 2019/0067462 A1* | 2/2019 | Tamura | H01L 29/0804 |
| 2019/0288106 A1* | 9/2019 | Uchida | H01L 29/7811 |
| 2020/0020765 A1* | 1/2020 | Mori | H01L 29/7395 |

FOREIGN PATENT DOCUMENTS

| | | |
|---|---|---|
| DE | 102006025958 B3 | 10/2007 |
| DE | 102007057728 A1 | 6/2009 |

* cited by examiner

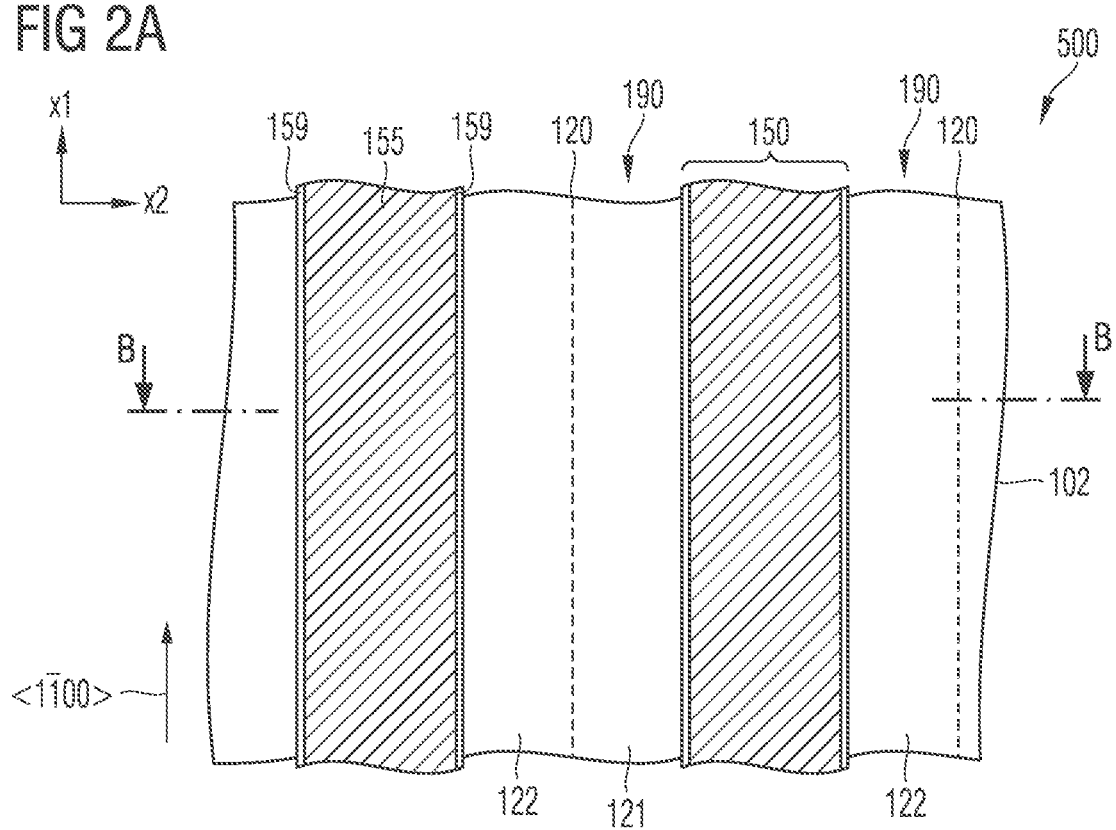
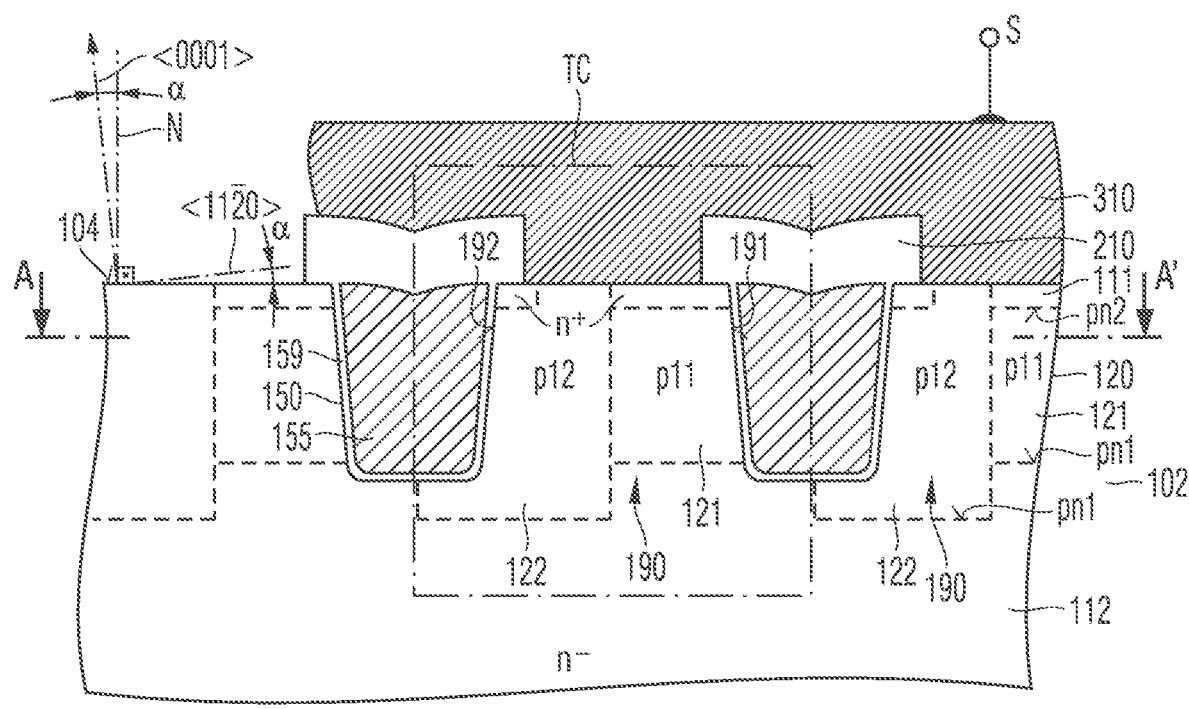

SILICON CARBIDE SEMICONDUCTOR COMPONENT

TECHNICAL FIELD

The present application relates to SiC (silicon carbide) semiconductor components, for example semiconductor switches with low on resistance and high dielectric strength.

BACKGROUND

Semiconductor components with a broad bandgap are based on a semiconductor material having a bandgap of at least 2 eV or at least 3 eV and, by comparison with conventional silicon-based semiconductor devices, enable a lower on resistance, operation at high temperatures, lower switching losses and/or lower leakage currents. In the configuration of SiC semiconductor components, it is necessary to optimize a multitude of different component parameters, for example doping and dimensioning of semiconductor areas with regard to required component properties such as on resistance or else turn-off characteristics. Compromises have to be entered into here in the required component properties since the change in one component parameter can have different effects on the component properties, for example can lead to an improvement in one component property with simultaneous deterioration in another component property. Against this background, the application is concerned with the improvement of the turn-off operation of SiC semiconductor components.

SUMMARY

This disclosure relates to a semiconductor component having an SiC semiconductor body. A first load terminal is formed on a first surface of the SiC semiconductor body. A second load terminal is formed on a second surface, opposite the first surface, of the SiC semiconductor body. The semiconductor component additionally has a drift zone of a first conductivity type in the SiC semiconductor body and a first semiconductor area of a second conductivity type electrically connected to the first load terminal. A pn junction between the drift zone and the first semiconductor area defines a voltage blocking strength of the semiconductor component. A second semiconductor area of the second conductivity type is formed between at least part of the drift zone and the second surface.

Those skilled in the art will recognize additional features and advantages upon reading the following detailed description, and upon viewing the accompanying drawings.

BRIEF DESCRIPTION OF THE DRAWINGS

The accompanying drawings serve for understanding of working examples, are incorporated into the disclosure and form part thereof. The drawings merely illustrate working examples and serve to elucidate them together with the description. Further working examples and numerous advantages of those intended are immediately apparent from the detailed description which follows. The elements and structures shown in the drawings are not necessarily shown to scale with respect to one another. Identical reference numerals refer to identical or corresponding elements and structures.

FIG. 2A is a schematic horizontal cross section through a section of a semiconductor component in a working example of the component top region shown in FIGS. 1A and 1B with stripe-like transistor cells and deep trench gate electrodes, and a transistor channel on one side.

FIG. 2B is a schematic vertical cross section through the section of the semiconductor component of FIG. 2A along the cross section line B-B.

DETAILED DESCRIPTION

Figure 1A:
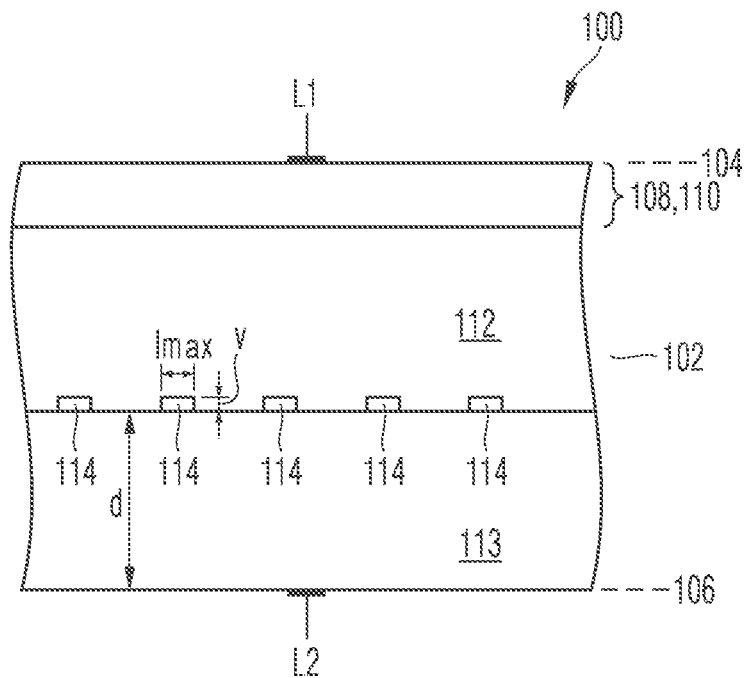
FIGS. 1A and 1B are schematic cross-sectional views of SiC semiconductor components with a flexible component top region according to working examples.

The detailed description which follows makes reference to the accompanying drawings, which form part of the disclosure and in which specific working examples of an SiC semiconductor component are shown for illustration purposes. The existence of further working examples will be self-evident. It will likewise be self-evident that structural and/or logical alterations may be made to the working examples without departing from what has been defined by the claims. In that respect, the description of the working examples is non-limiting. More particularly, features of working examples described hereinafter can be combined with features of others of the working examples described, unless the opposite is apparent from the context.

The terms "have", "contain", "comprise", "include" and similar terms are unrestricted terms and show the presence of the structures, elements or features identified, but do not rule out the presence of additional elements or features. The indefinite articles and the definite articles shall encompass both the plural and singular unless the opposite is clearly apparent from the context.

The expression "electrically connected" describes a low-ohm connection between the electrically connected elements, for example direct contact between the elements in question or a connection via a metal and/or a highly doped semiconductor. The expression "electrically coupled" includes the possibility that one or more elements suitable for passage of current may be present between the "electrically coupled" elements, for example elements that are controllable in such a way that they can temporarily establish a low-ohm connection in a first state and a high-ohm decoupling in a second state.

The figures illustrate relative dopant concentrations by the signs of "−" or "+" alongside the doping type "n" or "p". For example, "n⁻" indicates a dopant concentration lower than the dopant concentration of an "n" doping area, whereas the dopant concentration in an "n⁺" doping area is higher than in an "n" doping area. Doping areas of the same relative dopant concentration do not necessarily have the same absolute dopant concentration. For example, two different "n" doping areas may have the same dopant concentration or different absolute dopant concentrations. The expression "dopant concentration" refers to a net dopant concentration, unless the opposite is apparent from the context.

If a range of values with the specification of a limit or two limits is defined for a physical parameter, the prepositions "from" and "to" or "less than" and "more than" include the respective limit. A statement of the "from . . . to" type is accordingly understood to mean "from at least . . . to at most". Correspondingly, a statement of the "less than . . . " ("more than . . . ") type is understood as "at most . . . " ("at least . . . ").

One working example relates to a semiconductor component having an SiC semiconductor body. The semiconductor component has a first load terminal on a first surface of the SiC semiconductor body and a second load terminal on a second surface of the SiC semiconductor body opposite the first surface. The semiconductor component additionally has a drift zone of a first conductivity type in the SiC semiconductor body and a first semiconductor area of a second conductivity type electrically connected to the first load terminal. A pn junction between the drift zone and the first semiconductor area defines a blocking strength of the semiconductor component. A second semiconductor area of the second conductivity type is formed between at least part of the drift zone and the second surface.

For example, the SiC semiconductor body may be constructed from monocrystalline silicon carbide (SiC), for example 2H-SiC (SiC of the 2H polytype), 6H-SiC or 15R-SiC. In one working example, the material of the SiC semiconductor body is 4H-SiC. What is meant here and hereinafter by a component being "composed of" a material or being "formed from" a material may be that said component consists of the material within the scope of manufacturing tolerances and with the exception of dopants.

The first surface may form the front side of the SiC semiconductor body and be planar or corrugated. A corrugated first surface may be caused by tilting of a main lattice plane of the SiC semiconductor body to a growth direction. A normal to a first section of the first surface or to a middle plane of a corrugated first surface defines the vertical direction. The vertical direction may run parallel to the growth direction. In the case of a corrugated first surface, this may comprise coplanar surface sections that each run obliquely, i.e. in an inclined manner, to the vertical direction. Directions at right angles to the vertical direction or, in other words, parallel to a flat section of the first surface or parallel to the middle plane of a corrugated first surface are lateral (horizontal) directions.

The semiconductor component is, for example, a unipolar semiconductor component, for example a field-effect transistor (FET) such as a MOSFET (metal oxide semiconductor FET). If the semiconductor component is an FET, the first load terminal may be a source terminal and the second load terminal may be a drain terminal. The first semiconductor area forms, for example, a body area or a shielding area. The semiconductor component may also take the form, for example, of a unipolar semiconductor component in the form of a Schottky diode or a merged PIN Schottky (MPS) diode. If the semiconductor component is an MPS diode, the first load terminal may be an anode terminal and the second load terminal may be a cathode terminal. The first semiconductor area forms, for example, an anode area. The semiconductor component may likewise, for example, also take the form of a unipolar semiconductor component in the form of a junction field-effect transistor (JFET). If the semiconductor component is a JFET, the first load terminal may be a source terminal and the second load terminal may be a drain terminal. The first semiconductor area forms, for example, a semiconductor area that serves for construction of the barrier layer and is of an opposite conductivity type from the drift zone, for example a buried semiconductor area in the case of a vertical JFET with a lateral channel.

In a further working example, the semiconductor component is configured as a bipolar semiconductor component, for example as an insulated gate field-effect transistor (IGBT). If the semiconductor component is an IGBT, the first load terminal may, for example, be an emitter terminal and the second load terminal may, for example, be a collector terminal. The first semiconductor area forms, for example, a body area or a shielding area.

The semiconductor component may also take the form, for example, of a bipolar semiconductor component in the form of a diode, for instance a power semiconductor diode and/or a PN diode. If the semiconductor component is a diode, the first load terminal may, for example, be an anode terminal and the second load terminal may be a cathode terminal. The first semiconductor area forms, for example, an anode area.

The semiconductor component may likewise also take the form, for example, of a bipolar junction transistor (BJT). If the semiconductor component is a BJT, the first load terminal may, for example, be a base terminal and the second load terminal may be a collector terminal. The first semiconductor area forms, for example, a base area.

The second semiconductor area in the drift zone enables provision of free charge carriers during a turn-off or commutation operation that enable a soft turn-off, i.e. soft drainage of the space charge zone during the turn-off operation (called softness). This avoids unwanted overvoltage peaks in the turn-off operation. In the case of SiC MPS diodes or SiC Schottky diodes, the second semiconductor area can also help to damp oscillations in the commutation. Such oscillations can be the cause, for example, of EMC (electromagnetic compatibility) problems on application. In the case of fast-switching SiC-MOSFETs as well, significant oscillations on switching can be counteracted in order thus to avoid parasitic turning-on again and elevated losses.

In the described SiC-based semiconductor components, it is possible here to profit in an advantageous manner from the fact that the dopants in the second semiconductor area introduced by means of ion implantation for example (e.g. aluminum, gallium or boron) diffuse only to a very minor degree. This makes it possible firstly to ensure very well-defined pn junctions to the second semiconductor area and hence very good reproducibility of breakdown characteristics of these pn junctions, and secondly also to keep the vertical extent of these areas very small. The result is thus a small use of volume by the second areas. This in turn has a very advantageous effect on the voltage drop in the on state of these components, since this increases the proportion of the current-conducting area, for example the drift zone. Particularly by comparison with bipolar components such as the diode or the IGBT, this is significant because there is no flooding with free charge carriers in the case of conventional unipolar SiC power semiconductors. If, for instance, such silicon-based components are produced by means of epitaxial methods for example, one is exposed to a not inconsiderable and hence also disruptive vertical extent of these areas.

In one working example, dopants in the second semiconductor area comprise deep defects, the energy gap of which from the closest band edge is more than 160 meV or even not less than 200 meV, for example 210 meV. In the case of a second p-type semiconductor area, it is possible to use one of or a combination of the dopant species aluminum (Al), gallium (Ga) and boron (B) for doping. The energetically low-lying dopant level may bring the advantage that the advantageous effect of the second semiconductor area occurs to a greater degree at higher temperatures. By virtue of the large energy gap of the p-type dopant level from the valence band edge, it is possible that the dopant atoms are only partly ionized and release only a small portion of their charge carriers. With rising temperature, the degree of ionization can increase and more charge carriers can be released. This means that the desired effect can increase with temperature. In addition, this can result in the positive effect that low energy levels result in elevated recombination of charge carriers and hence the p-doped areas contribute to a decrease in the spread of stacking faults in SiC components and hence also to avoidance or at least reduction in what is called bipolar degradation. Since it is possible especially in the case of boron atoms that, on the one hand, the predominant proportion of the boron atoms introduced diffuses only relatively slowly, while, on the other hand, a small, different proportion can diffuse much more quickly, it may be advantageous for the total concentration of the boron atoms introduced to be such that the concentration of the fast proportion lies below the drift zones and an optionally present buffer doping.

In one working example, the second semiconductor area has a maximum lateral extent within a range from 500 nm to 300 µm or else within a range between 1 µm and 100 µm, or else within a range between 2 and 50 µm or else within a range between 5 and 30 µm. This makes it possible, for example, to keep any voltage drop in the on state of the semiconductor component low and hence to counteract any unwanted effect of the second semiconductor area in the on state of the semiconductor component. A geometry of the second semiconductor area may be varied, for example assumes the form of stripes or islands. The second semiconductor area may likewise be a coherent area having holes or other gaps.

In one working example, the second semiconductor area has a vertical extent v within a range from 20 nm to 1 µm or 50 nm to 500 nm. The small vertical extent of the second semiconductor area offers the technical advantage, for example, of a small voltage drop in the on state of the semiconductor component. In view of the only small diffusion of the dopants in SiC by virtue of the thermal budget during the production of the component, it is possible to achieve such small vertical dimensions by ion implantation, for example.

The lateral and vertical dimensions of the second semiconductor area may be matched to one another, for example, with regard to the voltage drop in the on state and the effect on turn-off/commutation of the semiconductor component.

In one working example, multiple second semiconductor areas are or a coherent second semiconductor area with openings is disposed in the drift zone or a buffer zone, where an area proportion of the multiple second semiconductor areas or of the coherent second semiconductor area in relation to an active area of the semiconductor component is within a range from 10% to 50%, or else from 15% to 30%.

In this context, the active area refers to that area into which a load current can flow on a front face of the SiC semiconductor substrate, i.e., in the case of a MOSFET, the area on the front face of the SiC semiconductor substrate that has been provided with source contacts. For example, the area of an edge region with edge conclusion structures such as JTE (junction termination extension) structures or VLD (variation of lateral doping) structures does not form part of the active area. The area proportion can be set, for example, as a compromise between optimized on state and optimized softness on turn-off.

In one working example, a ratio of minimum lateral separation of adjacent second semiconductor areas and minimum or maximum lateral extent of the second semiconductor area is within a range from 0.1 to 20 or else within a range between 1 and 5. The minimum lateral extent of adjacent second semiconductor areas is, for example, at least 1 µm or at least 3 µm or at least 5 µm. For example, the minimum separation of adjacent further semiconductor areas is 1 µm. The volume filled by the second semiconductor areas is thus small compared to the total volume of the drift zone.

In one working example, a blocking strength of the semiconductor component is within a range from at least 400 V to at most 15 kV, for example at most 10 kV and especially at most 6.5 kV. Blocking strength can be influenced and hence adjusted, for example, by suitable choice of doping and vertical extent of the drift zone.

In one working example, the semiconductor component is a power semiconductor component that has a specified current-carrying capacity between the first load terminal and the second load terminal of at least 1 A.

In one working example, the dopants include one or more elements selected from aluminum, boron, gallium, chromium, iridium.

In a further working example, the second semiconductor area is buried in an electrically floating arrangement at a vertical distance from the second surface in the SiC semiconductor body. For example, the second semiconductor area may be disposed in the region of a junction between a highly doped semiconductor substrate and a drift zone portion having low or moderate doping. The second semiconductor area may likewise have been embedded into a field stop zone or buffer zone.

In one working example, the semiconductor component additionally has a third semiconductor area of the first conductivity type, formed between the second semiconductor area and the second surface and adjoining the second semiconductor area. Net doping in the second semiconductor area is greater than in a fourth semiconductor area of the first conductivity type that adjoins the third semiconductor area at the same depth in the SiC semiconductor body. The third semiconductor area makes it possible, for example, to control a breakdown voltage of a pn junction between the second semiconductor area and the third semiconductor area which is on the reverse side, i.e. directed toward the second surface, in order thus to contribute to sufficient softness during the turn-off operation of the component and hence to a minimum overvoltage of the component by additional injection of holes during the turn-off operation at a particular current density.

In one working example, a maximum lateral extent of the third semiconductor area corresponds to a maximum lateral extent of the second semiconductor area. In an alternative embodiment, a maximum lateral extent of the third semiconductor area is less than a maximum lateral extent of the second semiconductor area. The third semiconductor area may generally have a vertical extent within a range from 20 nm to 1.5 µm or 50 nm to 1 µm.

In one working example, the semiconductor component has scatter sites for reduction of charge carrier mobility in the third semiconductor area. It is thus possible, in an advantageous manner, to increase a lateral voltage drop below the second semiconductor area. The scatter sites may comprise, for example, lattice defects, electrically inactive dopants or dopants for partial compensation for the doping in the third semiconductor area, or a combination thereof.

In a further working example that may be suitable for increasing the lateral voltage drop at lower operating temperatures, dopants having a maximum separation from the closest band edge may be chosen for the third semiconductor area. For example, the energy gap of the dopants from the closest band edge is at least 160 meV or is not less than 200 meV. In the case of an n-type third semiconductor area, it is possible to choose for this purpose, in SiC, for example, chromium (Cr), iridium (Ir), selenium (Se), sulfur (S) or a combination thereof.

In a further working example, the semiconductor component additionally has a fifth semiconductor area of the first conductivity type, formed between the third semiconductor area and the second surface and adjoining the third semiconductor area. Net doping in the fifth semiconductor area is less than in the third semiconductor area. The fifth semiconductor area may, for example, be a buffer zone such as a field stop zone. A dopant concentration in the buffer zone may, for example, be in the range of $5 \times 10^{16}$ cm$^{-3}$ to $5 \times 10^{18}$ cm$^{-3}$ or else in the range between $2 \times 10^{17}$ cm$^{-3}$ and $2 \times 10^{18}$ cm$^{-3}$.

A sixth semiconductor area, for example a further buffer zone, may also extend between the second semiconductor area and the drift zone and have a vertical extent between 300 nm and 5 µm or between 1 and 4 µm. A dopant concentration of the sixth semiconductor area may, for example, be in the range of $5 \times 10^{16}$ cm$^{-3}$ to $5 \times 10^{18}$ cm$^{-3}$ or else in the range between $2 \times 10^{17}$ cm$^3$ and $2 \times 10^{18}$ cm$^{-3}$.

In a further working example, the second semiconductor area adjoins the second surface, for example adjoins a contact such as a metallization on the second surface. Unlike in the working examples in which the second semiconductor area is vertically spaced apart from the second surface, a charge carrier injection from the second area into the drift zone, for example an injection of holes, in the turn-off operation is not based on an avalanche mechanism but on a boosting effect of the second semiconductor area. By virtue of the p areas adjoining the metallization of the second surface, holes can be injected into the first semiconductor area when the lateral voltage drop across the second semiconductor area is increased with appropriate current flow in the adjoining n area that faces the drift zone during the turn-off operation of this second semiconductor area.

In one working example, the drift zone is of the n type. In other words, the first conductivity type in this working example is an n type. It is generally possible that dopants in the drift zone comprise defects, the energy gap of which from the conduction band edge is less than 140 meV. In the case of an n-type as first conductivity type, the deep dopants in the drift zone may, for example, be nitrogen (N) and/or phosphorus (P).

The schematic cross-sectional view of FIG. 1A shows a working example of a unipolar semiconductor component 100. The semiconductor component 100 has an SiC semiconductor body 102 and a first load terminal L1 on a first surface 104 of the semiconductor body 102. The semiconductor component 100 likewise has a second load terminal L2 on a second surface 106 of the semiconductor body 102 opposite the first surface 102.

Adjoining the first surface 104, a component top region 108 is formed, which, according to the type of unipolar semiconductor component, comprises different structural elements that serve for the mode of function of the respective component type, e.g. MOSFET, MPS diode or JFET. These structural elements also include a p-doped first semiconductor area 110, assigned in the schematic view of FIG. 1A, in simplified form, to the component top region 108.

The semiconductor component additionally has an n$^-$-doped drift zone 112 in the SiC semiconductor body 102. Between the n$^-$-doped drift zone 112 and the second surface 106 is disposed an n$^+$-doped semiconductor substrate 113.

The p-doped first semiconductor area 110 in the component top region 108 is electrically connected to the first load terminal L1, where a pn junction between the n$^-$-doped drift zone 112 and the p-doped first semiconductor area 110 defines a voltage blocking capacity of the semiconductor component 100.

Multiple p-doped second semiconductor areas 114 are formed between at least part of the n$^-$-doped drift zone 112 and the second surface 106. In the working example of FIG. 1A, the second semiconductor areas 114 are formed at the transition between the n$^-$-doped drift zone 112 and the n$^+$-doped semiconductor substrate 113.

The details given with regard to the effect and configuration of the second semiconductor area 114 in the above working examples, for example a maximum lateral extent lmax, a vertical extent v, an area proportion of the second areas 114, a vertical distance d from the second surface 106, may be applied to FIG. 1A and the working examples which follow in the form of drawings.

The first load terminal L1 is shown in simplified form as the first contact. This is, for example, a conductive structure which may include mutually electrically connected conductive components, for instance contact plugs, metallization tracks and terminal pads. The electrically conductive components in turn consist of conductive material, for instance a metal, a metal silicide, a metal alloy, a highly doped semiconductor or a combination thereof. These electrically conductive components are, for example, parts of a metallization and wiring region of the semiconductor component 100 which is formed by means of the first surface 104. The second load terminal L2 is shown in simplified form as the second contact. The details given above with regard to the first load terminal L1 are applicable mutatis mutandis to the second load terminal L2.

Figure 1B:
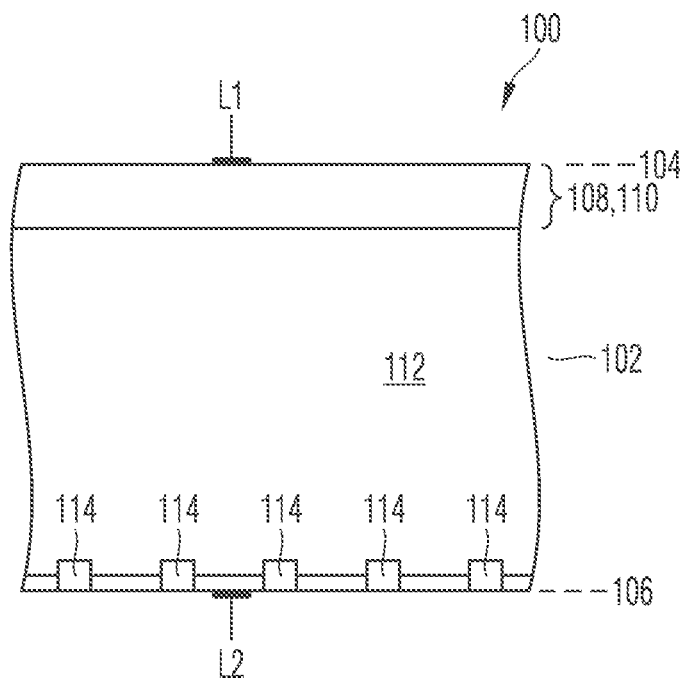

The schematic cross-sectional view of FIG. 1B shows a further working example of a unipolar semiconductor component 100, which differs from the unipolar semiconductor component 100 of FIG. 1A in that the second area 114 directly adjoins the second surface 106.

The details given in the above working examples with regard to the effect and configuration of the second semiconductor area 114, for example a maximum lateral extent lmax, a vertical extent v, an area proportion of the second areas 114, may be applied to FIG. 1B and the working examples which follow in the form of drawings.

FIGS. 2A to 7 show illustrative configurations of the component top region 108 of the working examples of FIGS. 1A and 1B.

FIGS. 2A and 2B show a semiconductor component 500 with the SiC semiconductor body 102 with stripe-like transistor cells TC and deep trench gate structures 150.

On a front side, the SiC semiconductor body 102 has the first surface 104 which may comprise coplanar surface sections which may form a ribbed first surface. The first surface 104 may coincide with a main lattice plane or run with an angle deviation α obliquely to a lattice plane, for example to the (0001) lattice plane, where the angle deviation may be at most 12°, for example about 4°.

In the embodiment described, the <0001> crystal direction is inclined by an angle deviation α relative to a normal N. The <11-20> crystal direction is inclined by the same angle deviation α relative to the horizontal plane. The <1-100> crystal direction is orthogonal to the cross-sectional plane.

In the SiC semiconductor body 102, the lightly n-doped drift zone 112 is formed.

Transistor cells TC on the front side of the SiC semiconductor body 102 are formed along gate structures 150 that extend from the first surface 104 into the SiC semiconductor body 102, with separation of adjacent gate structures 150 from one another by mesa sections 190 of the SiC semiconductor body 102.

A longitudinal extent of the gate structures 150 in a first horizontal direction x1 is greater than a width of the gate structures 150 in a second horizontal direction x2 orthogonal to the first horizontal direction and transverse to the longitudinal extent. The gate structures 150 may be elongated trenches that extend from one side of a cell field region having the transistor cells TC as far as an opposite side. The length of the gate structures 150 may be up to several hundreds of micrometers, or up to several millimeters or even up to several centimeters.

In other working examples, the gate structures 150 may be formed along parallel lines that each extend from one side of the cell field region to the opposite side, in which case a multitude of separate gate structures 150 are formed in each case along the same line. The gate structures 150 may also form a lattice with the mesa sections 190 in the meshes of the lattice.

The gate structures 150 may be homogeneously spaced apart from one another, may have the same width and/or may form a regular pattern. A middle-to-middle separation of the gate structures 150 may be within a range from at least 1 μm to at most 10 μm, for example from at least 2 μm to at most 5 μm. A vertical extent of the gate structures 150 may be at least 300 nm to at most 5 μm, for example within a range from at least 500 nm to at most 2 μm.

Side walls of the gate structures 150 may be aligned vertically relative to the first surface 108 or may be tilted slightly against the vertical direction, and mutually opposite side walls may run parallel or obliquely to one another. In one embodiment, the width of the gate structures 150 decreases with increasing distance from the first surface 104. For example, one side wall deviates from the normal N by the angle deviation α and the other side wall by −α.

The mesa sections 190 have two opposite mesa side walls 191, 192 that directly adjoin two adjacent gate structures 150. At least one first mesa side wall 191 lies in a lattice plane with high charge carrier mobility, for example in the case of 4H-SiC in a (11-20) lattice plane, called the A plane. The second mesa side wall 192 opposite the first mesa side wall 191 may be inclined relative to the lattice plane in question by twice the angle deviation α, for example by about 8°.

The gate structures 150 have a conductive gate electrode 155 that may have a highly doped polycrystalline silicon layer, a one-part or multipart metal structure or both. The silicon layer may be electrically connected to a gate metallization that forms or is electrically connected or coupled to a gate terminal.

Along at least one side of the gate structure 150, a gate dielectric 159 separates the gate electrode 155 from the SiC semiconductor body 102. The gate dielectric 159 may be a semiconductor dielectric, for example a thermally grown or deposited semiconductor oxide, e.g. silicon oxide, a semiconductor nitride, for example a deposited or thermally grown silicon nitride, a semiconductor oxide nitride, for example a silicon oxynitride, another deposited dielectric metal or any combination of the materials mentioned. The layer thickness of the gate dielectric 159 may be chosen, for example, such that a threshold voltage of the transistor cells TC is within a range from 1 V to 8 V.

The gate structures 150 may have exclusively the gate electrode 155 and the gate dielectric 159 or may, in addition to the gate electrode 155 and the gate dielectric 159, have further conductive and dielectric structures, for example field plates and separation dielectrics.

In the mesa sections 190, source areas 111 are formed toward the front side of the SiC semiconductor body 102, which may directly adjoin the first surface 104 and the first mesa side wall 191 of the respective mesa section 190. In this case, each mesa section 190 may have a source area 111 with sections connected to one another in the SiC semiconductor body 102 or with at least two sections separated from one another in the SiC semiconductor body 102, which have low-ohm electrical connection to one another via a contact or trench contact adjoining the mesa section 190.

The mesa sections 190 further include doped areas 120 that separate the source areas 111 from the drift zone 112, and form first pn junctions pn1 with the drift zone 112 and second pn junctions pn2 with the source areas 111. The doped areas 120 form an ohmic contact with a first load electrode 310.

In the working example shown, a doped area 120 forms a more lightly doped body area 121 and a more heavily doped shielding area 122. The more heavily doped shielding area 122 may correspond here to the first semiconductor area 110 of the component top region 108 of the working examples of FIGS. 1A and 1B.

The body area 121 directly adjoins the first mesa side wall 191. In the turned-on state of the transistor cell TC, in the body area 121, an inversion channel that connects the source area 111 to the drift zone 112 is formed along the gate structure 150. A vertical extent of the body area 121 corresponds to a channel length of the transistor cells TC and may, for example, be 200 nm to 1500 nm.

The shielding areas 122, which ensure protection of a base of the gate structure 150 (called trench base) in the case of high field strengths in the blocking state, are formed between the body areas 121 and the second mesa side walls 192 and may directly adjoin the body areas 121. A vertical extent of the shielding areas 122 may be greater than a vertical extent of the body areas 121, for example greater than a vertical extent of the gate structures 150. A portion of the shielding area 122 may be formed directly between the base of the gate structure 150 and the second surface 112 and shield the gate structure 150 from the potential of the second load electrode 320. A maximum dopant concentration p12 in the shielding areas 122 along the second mesa side walls 192 is higher, for example at least twice or even five times higher, than a maximum dopant concentration p11 in the body areas 121 along the first mesa side walls 191.

The first load electrode 310 may form a source terminal S or be electrically connected or coupled to the source terminal S.

In one working example, the transistor cells TC are re-channel FET cells with p-doped body areas 121, n-doped source areas 111 and the n-doped drift zone 112. In another embodiment, the transistor cells TC are p-channel FET cells with n-doped body areas 121, p-doped source areas 111 and a p-doped drift zone 131.

A load current that flows through the SiC semiconductor body 102 in the turned-on state of the semiconductor component 500 passes through the body areas 121 in inversion channels induced along the gate dielectric 159. The higher dopant concentration in the shielding areas 122 compared to the dopant concentration in the body areas 121, in operation within the absolute maximum ratings, suppresses the formation of inversion channels along the second mesa side walls 192 and especially offers protection of the base of the gate structure 150 in the case of high field strengths in the blocking state. Since this area serves especially to protect the base of the gate structure 150 in the blocking state, the doping of this area with dopants having low-lying energy levels is particularly advantageous. Since this area is to bring about only relatively low injection of free charge carriers, this is ensured in the on state in an excellent manner by the only relatively low activation of these dopants, but without having to accept losses in the protective effect for the base of the gate structure 150, since these atoms having low-lying energy levels are again nearly completely activated as soon as they lie within a space charge zone.

Figure 3:
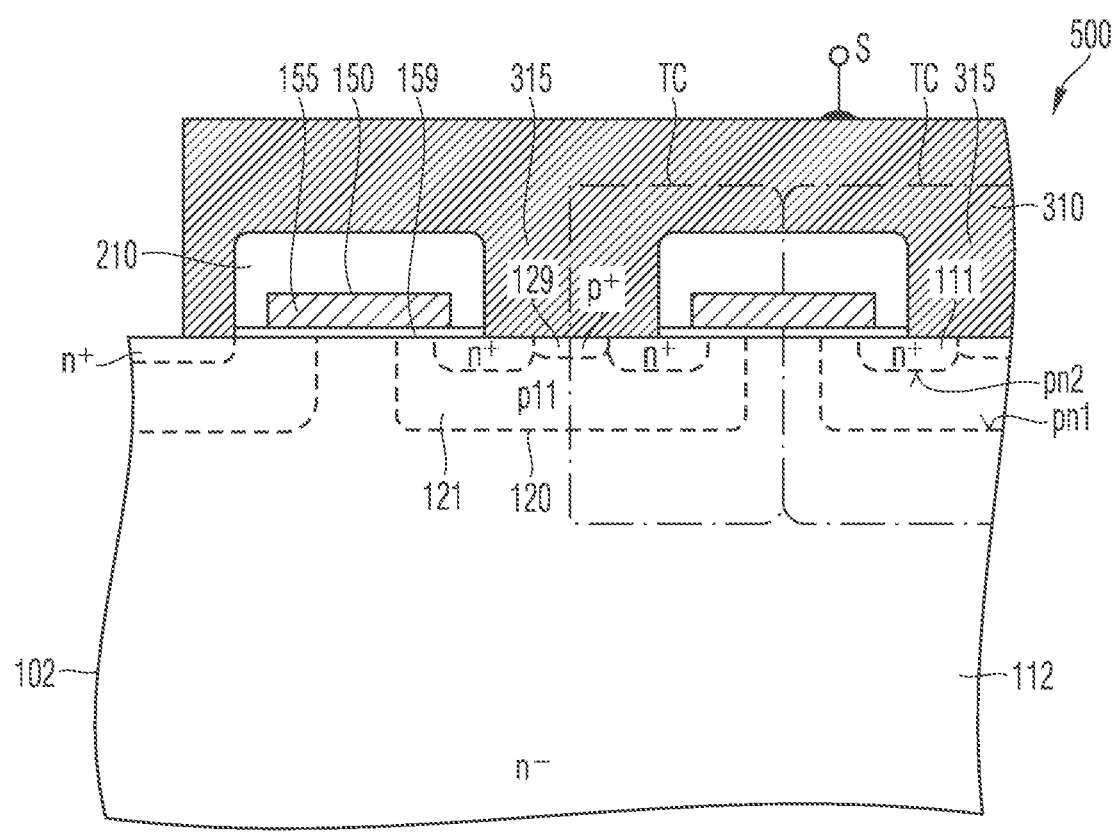
FIG. 3 is a schematic vertical cross section through a section of a semiconductor component in one working example of the component top region shown in FIGS. 1A and 1B with planar gate structures.

FIG. 3 shows a semiconductor component 500 with planar gate structures 150 on the front side of the SiC semiconductor body 102, wherein an individual gate structure 150 within a cell field region is assigned two transistor cells TC formed symmetrically with respect to the gate structure 150.

The gate structures 150 comprise a conductive gate electrode 155 and a gate dielectric 159 which is formed directly on the first surface 104 and separates the gate electrode 155 from the SiC semiconductor body 102. A doped area 120 that extends from the first surface 104 into the SiC semiconductor body 102 is in each case assigned two adjacent transistor cells TC of two adjacent gate structures 150. Source areas 111 of the two transistor cells TC extend from the first surface 104 into the doped area 120. The doped area 120 has a contact area 129 in which the dopant concentration is higher than the dopant concentration in a main area of the doped area 120 outside the contact area 129 which may adjoin the first surface 104 between the source areas 111. The main area of the doped area 120 forms the body area 121 of the transistor cell TC.

The drift zone 112 is formed within the SiC semiconductor body 102, and the drift zone 112 may extend between adjacent body areas 121 and below the gate electrodes 155 to the first surface 108.

In the turned-on state, the transistor cells TC form lateral inversion channels in channel regions of the body areas 121 along the gate dielectric 159, which connect the source areas 111 to the sections of the drift zone 112 that adjoin the first surface 108. The body area 121 may correspond, for example, to the first semiconductor area 110 of the component top region 108 of the working examples of FIGS. 1A and 1B.

An interlayer dielectric 210 separates the gate electrode 155 from a first load electrode 310 on the front side of the SiC semiconductor body 102. Contacts 315 in openings of the interlayer dielectric 210 connect the first load electrode 310 to the contact areas 129 and the source areas 111.

Figure 4:
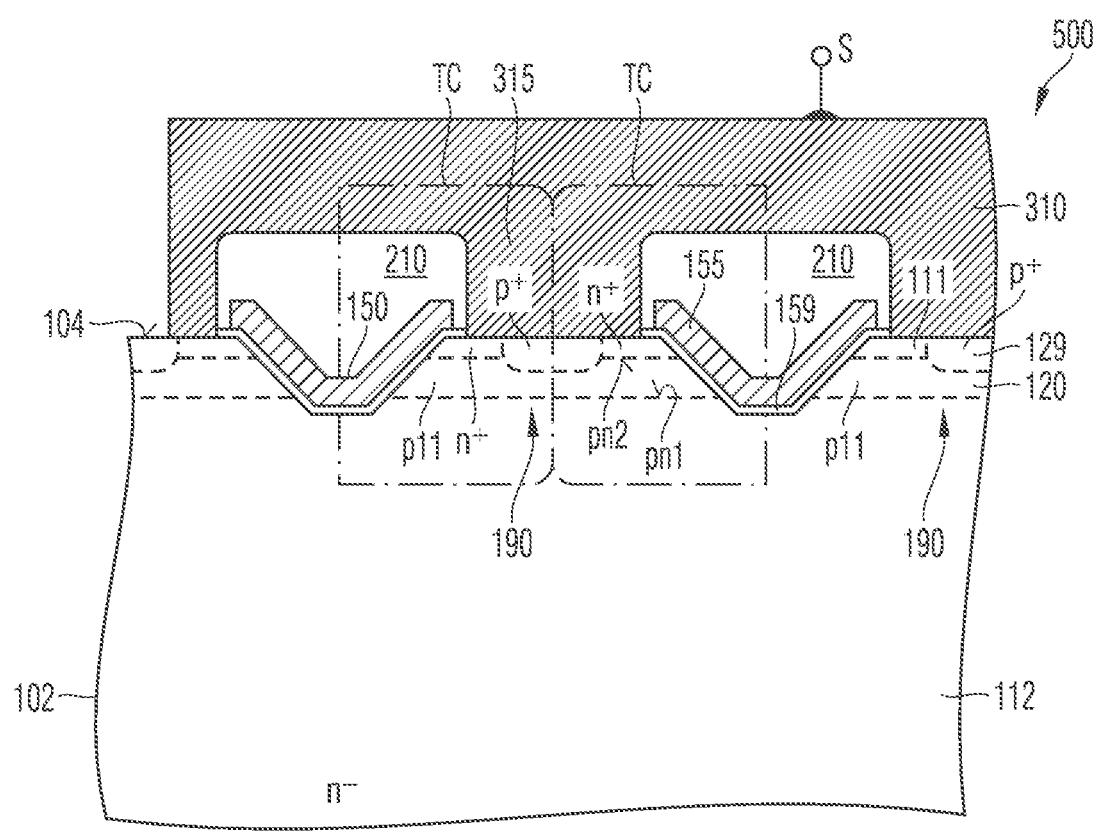
FIG. 4 is a schematic vertical cross section through a section of a semiconductor component in one working example of the component top region shown in FIGS. 1A and 1B with flat trench gate structures.

In FIG. 4, the gate structures 150 are formed in flat trenches with a nearly V-shaped vertical cross-sectional area. The gate electrode 155 may extend in a nearly homogeneous layer thickness along the side walls and the base of the trenches. Mesa sections 190 of the SiC semiconductor body 102 between adjacent gate structures 150 comprise source areas 111 formed along the first surface 108 and doped areas 120 between the source areas 111 and the drift zone 112, and the doped areas 120 may each have a more lightly doped body area 121 and a more heavily doped contact area 129. The body area 121 may correspond, for example, to the first semiconductor area 110 of the component top region 108 of the working examples of FIGS. 1A and 1B.

Figure 5:
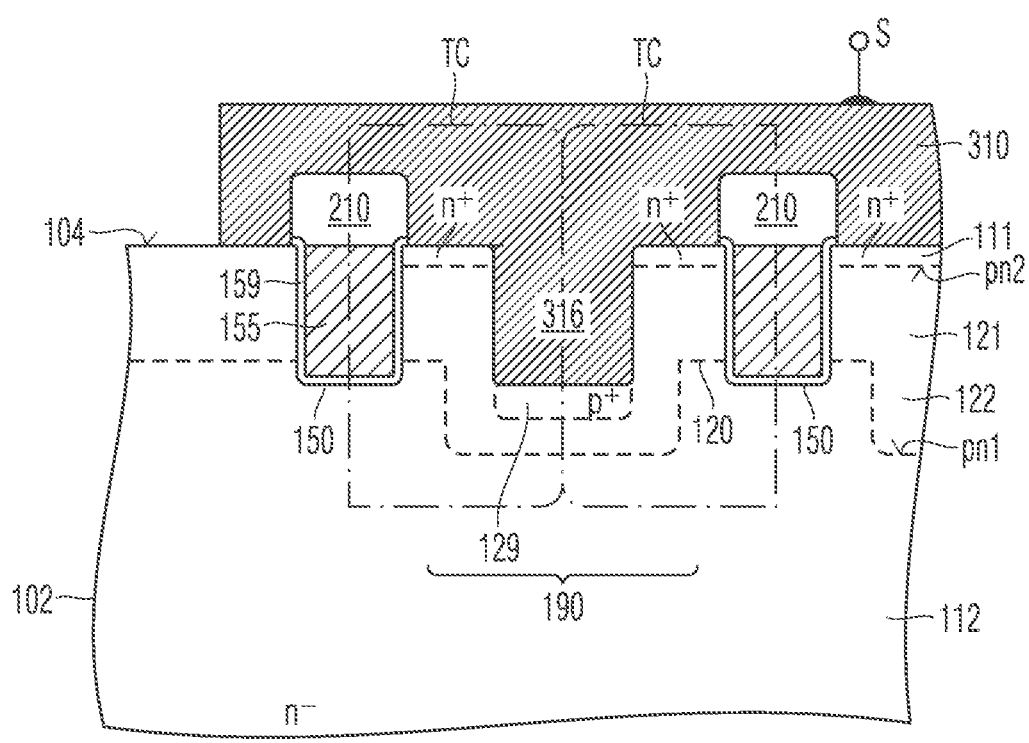
FIG. 5 is a schematic vertical cross section through a section of a semiconductor component in a further working example of the component top region shown in FIGS. 1A and 1B with deep trench gate structures.

The semiconductor component 500 of FIG. 5 has gate structures 150 that extend from the first surface 104 into a SiC semiconductor body 102, where the side walls of the gate structures 150 run vertically to the first surface 108. In mesa sections 190 of the SiC semiconductor body 100 between adjacent gate structures 150, doped areas 120 are formed, which form first pn junctions pn1 with the drift zone 112 and second pn junctions pn2 with source areas 111 formed along the first surface 108.

An interlayer dielectric 210 separates a gate electrode 155 of the gate structures 150 from a first load electrode 310. Between adjacent gate structures 150, trench contacts 316 extend from the first load electrode 310 into the mesa sections 190, form lateral contacts with the SiC semiconductor body 102 and connect the source areas 111 to the first load electrode 310. A vertical extent of a section of the trench contact 316 in the SiC semiconductor body 102 may correspond roughly to the vertical extent of the gate structures 150.

A portion of the doped area 120 may in each case be formed beneath the trench contacts 316 and separate these from the drift zone 112. A more heavily doped contact area 129 of the doped area 120 may directly adjoin the trench contact 316. The body area 121 may correspond to the first semiconductor area 110 of the component top region 108 of the working examples of FIGS. 1A and 1B.

Figure 6:
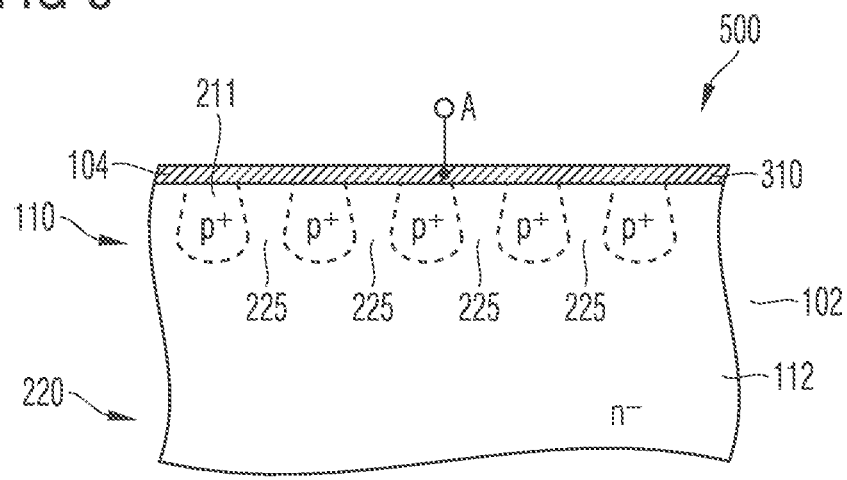
FIG. 6 is a schematic vertical cross section through a section of an SiC merged PIN Schottky (MPS) diode in a further working example of the component top region shown in FIGS. 1A and 1B.

The semiconductor component 500 shown in FIG. 6 is an MPS diode containing separate anode zones 211 that extend from the first surface 104 into the cathode structure 220, for example into the drift zone 112. The anode zones 211 may be in the form of stripes with a horizontal dimension that significantly exceeds the second horizontal dimension orthogonally to the first horizontal dimension, may be in the form of dots, where both horizontal dimensions are within the same order of magnitude, or may form a grid, for example a hexagonal grid. Between adjacent anode zones 211, channel regions 225 of the cathode structure 220 directly adjoin the metal anode electrode 310 and form Schottky contacts with the metal anode electrode 310. The metal anode electrode 310 may, for example, comprise Schottky contact regions that directly adjoin the anode zones 211, and main regions 312 that form ohmic contacts with the anode zones 211. The anode zone 211 may correspond to the first semiconductor area 110 of the component top region 108 of the working examples of FIGS. 1A and 1B.

Figure 7:
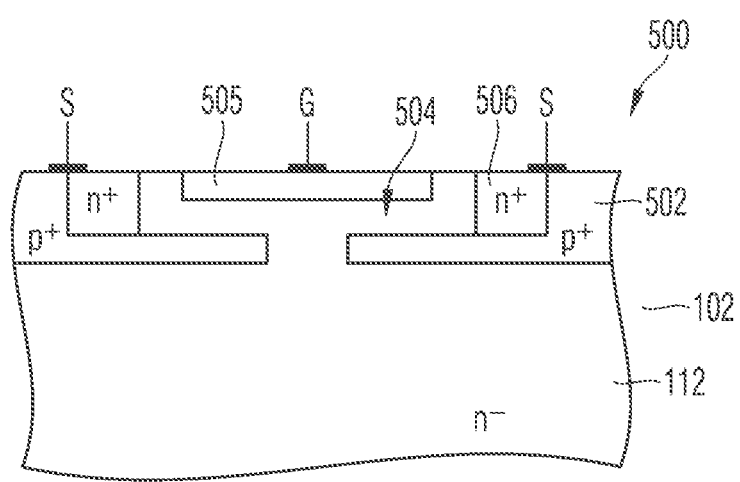
FIG. 7 is a schematic vertical cross section through a section of an SiC junction field-effect transistor in a further working example of the component top region shown in FIGS. 1A and 1B.

The semiconductor component 500 shown in FIG. 7 is an SiC JFET. The SiC JFET is illustrated by way of example as a vertical JFET with a lateral channel. The SiC JFET has a $p^+$-doped buried semiconductor area 502 that separates a channel region 504 from the drift zone 112. With the aid of this buried semiconductor area 502 and a gate electrode G and the $p^+$-doped control area 505 electrically connected thereto, the channel width is modulated. The channel connection is via an $n^+$-doped source area 506 which, together with the $p^+$-doped buried semiconductor area 502, is electrically connected to a source electrode S. The $p^+$-doped buried semiconductor area 502 may correspond to the first semiconductor area 110 of the component top region 108 of the working examples of FIGS. 1A and 1B.

The component types shown in FIGS. 2A to 7 are examples of the component top region 108 shown in the working examples of FIGS. 1A and 1B. It will be appreciated that the component types shown in FIGS. 2A to 7 may also be used in structural modifications in the component top region 108 of the working examples of FIGS. 1A and 1B.

Figure 8A:
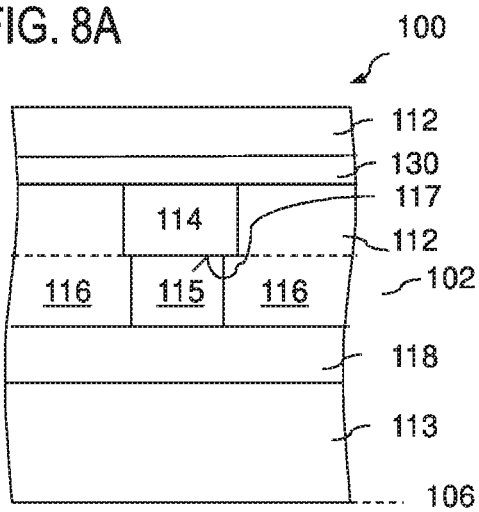
FIGS. 8A to 8D show schematic cross-sectional views with working examples of semiconductor areas that serve for charge carrier injection during the turn-off operation.

In the working example shown in the schematic cross-sectional view of FIG. 8A, the semiconductor component 100 additionally has a third semiconductor area 115 of the first conductivity type which is formed between the second semiconductor area 114 and the second surface 106 and adjoins the second semiconductor area 114. Net doping in the second semiconductor area 114 is greater than in a fourth semiconductor area 116 of the first conductivity type that adjoins the third semiconductor area 115 at the same depth in the SiC semiconductor body 102. The fourth semiconductor area 116 corresponds, for example, to a portion of the drift zone 112 or of a buffer zone. The third semiconductor area 115 enables control of a breakdown voltage of a pn junction 117 on the reverse side, i.e. facing the second surface 106, between the second semiconductor area 114 and third semiconductor area 115, in order thus to contribute to sufficient softness during the turn-off operation of the component and hence to a minimum overvoltage of the component by additional injection of holes during the turn-off operation at a particular current density.

Figure 8B:
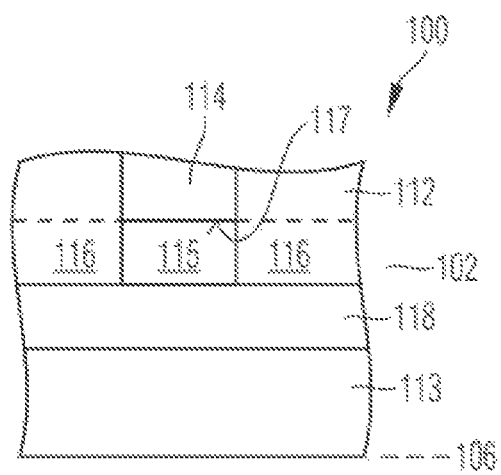

In the working example shown in FIG. 8A, a maximum lateral extent of the third semiconductor area 115 is less than a maximum lateral extent of the second semiconductor area 114. In the working example shown in FIG. 8B, a maximum lateral extent of the third semiconductor area 115 corresponds to a maximum lateral extent of the second semiconductor area 114. For example, the third semiconductor area 115 may have a vertical extent within a range from 100 nm to 1 μm.

Figure 8C:
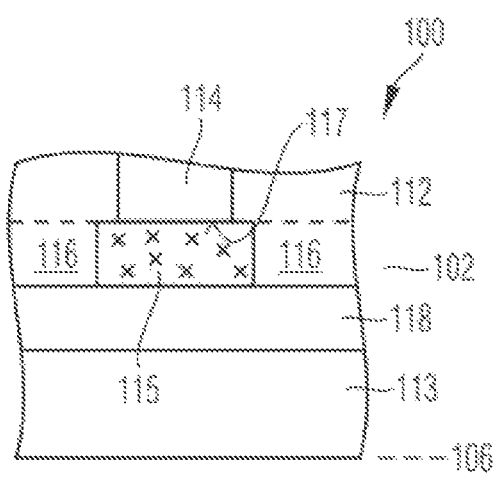

In the working example shown in FIG. 8C, the semiconductor component 100 additionally has scatter sites (illustrated in simplified form by "x") for reduction of charge carrier mobility in the third semiconductor area 115. It is thus possible, in an advantageous manner, to increase a lateral voltage drop beneath the second semiconductor area 114. The scatter sites may comprise, for example, lattice defects, electrically inactive dopants or dopants for partial compensation for the doping in the third semiconductor area, or a combination of these.

Figure 8D:
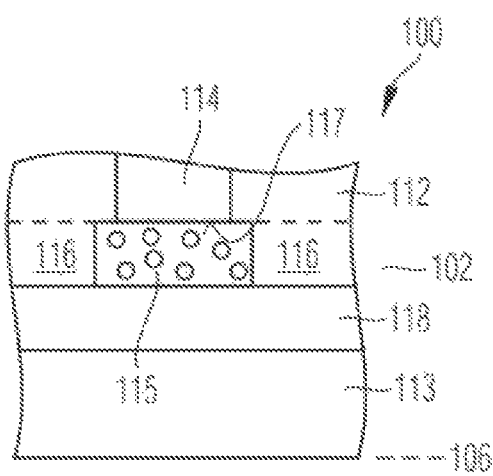

In a further working example shown in FIG. 8D, which is suitable for increasing the lateral voltage drop at relatively low operating temperatures, it is possible to choose dopants for the third semiconductor area (illustrated in simplified form by "o") that have a maximum separation from the closest band edge. In the case of an n-type third semiconductor area 115, in SiC, it is possible for this purpose to choose, for example, chromium (Cr), iridium (Ir), selenium (Se), sulfur (S) or a combination of these.

In the working examples shown in FIGS. 8A to 8D, the semiconductor component 100 additionally has a fifth semiconductor area 118 of the first conductivity type which is formed between the third semiconductor area 115 and the second surface 106 and which adjoins the third semiconductor area 115. Net doping in the fifth semiconductor area 118 is less than in the third semiconductor area 115. The fifth semiconductor area 118 may, for example, be a buffer zone such as a field stop zone. A dopant concentration of the buffer zone may, for example, be in the range of $5 \times 10^{17}$ cm$^{-3}$ to $5 \times 10^{18}$ cm$^{-3}$. A sixth semiconductor area 130 of the first conductivity type may be formed between the drift zone 112 and the second semiconductor area 114 and may be configured, for example, as a buffer zone like the fifth semiconductor area. Further working examples are immediately apparent from the working examples of FIGS. 8A to 8D, for example by omission of the fifth semiconductor area 118 or the sixth semiconductor area 130.

Charge carrier injection during the turn-off operation is achieved, for example, by avalanche generation at the pn junction 117.

Although specific embodiments have been illustrated and described herein, experts in the field will see that the specific embodiments shown and described can be replaced by a multitude of alternative and or equivalent configurations without deviating from the scope of protection of the invention. The application is intended to cover any adjustments or variations in the specific embodiments discussed herein. Therefore, the invention is limited solely by the claims and their equivalents.

What is claimed is:

1. A semiconductor component, comprising:
an SiC semiconductor body;
a first load terminal on a first surface of the SiC semiconductor body;
a second load terminal on a second surface of the SiC semiconductor body opposite the first surface;
a drift zone of a first conductivity type in the SiC semiconductor body;
a first semiconductor area of a second conductivity type which is electrically connected to the first load terminal;
a second semiconductor area of the second conductivity type between at least part of the drift zone and the second surface,
a third semiconductor area of the first conductivity type which is formed between the second semiconductor area and the second surface and forms an interface with the second semiconductor area; and
a fourth semiconductor area of the first conductivity type that laterally adjoins the third semiconductor area and is disposed below the interface;
a fifth semiconductor area of the first conductivity type that is disposed between the third semiconductor area and the second surface,
wherein a pn junction between the drift zone and the first semiconductor area defines a voltage blocking strength of the semiconductor component,
wherein dopants in the second semiconductor area have deep defects, the energy gap of which from a closest band edge is more than 160 meV,
and
wherein a net doping in the second semiconductor area is greater than in the fourth semiconductor area,
wherein a net doping in the third semiconductor area is greater than in the fifth semiconductor area,
wherein the semiconductor component further comprises scatter sites configured to reduce charge carrier mobility in the third semiconductor area, and
wherein the fourth semiconductor area is devoid of the scatter sites.

2. The semiconductor component of claim 1, wherein the second semiconductor area has a maximum lateral extent within a range from 500 nm to 300 μm.

3. The semiconductor component of claim 1, wherein the second semiconductor area has a vertical extent within a range from 20 nm to 1 μm.

4. The semiconductor component of claim 1, wherein the semiconductor component is a unipolar semiconductor component.

5. The semiconductor component of claim 4, wherein the unipolar semiconductor component is a merged PIN Schottky (MPS) diode, a Schottky diode, a field-effect transistor (FET), or a junction FET.

6. The semiconductor component of claim 1, wherein the voltage blocking strength is within a range from 400 V to 15 kV.

7. The semiconductor component of claim 1, wherein the semiconductor component is a power semiconductor component having a specified current-carrying capacity between the first load terminal and the second load terminal of at least 1 A.

8. The semiconductor component of claim 1, wherein the dopants comprise one or more elements selected from the group of elements consisting of aluminum, boron, gallium, chromium, and iridium.

9. The semiconductor component of claim 1, wherein the semiconductor component has a plurality of the second semiconductor areas, and wherein an area proportion of the plurality of second semiconductor areas in relation to an active area of the semiconductor component is within a range from 10% to 50%.

10. The semiconductor component of claim 1, wherein the second semiconductor area is buried in the SiC semiconductor body in an electrically floating arrangement at a vertical distance from the second surface.

11. The semiconductor component of claim 1, wherein a maximum lateral extent of the third semiconductor area corresponds to a maximum lateral extent of the second semiconductor area.

12. The semiconductor component of claim 1, wherein a maximum lateral extent of the third semiconductor area is less than a maximum lateral extent of the second semiconductor area.

13. The semiconductor component of claim 1, wherein the third semiconductor area has a vertical extent within a range from 20 nm to 1.5 µm.

14. The semiconductor component of claim 1, wherein the scatter sites comprise lattice defects.

15. The semiconductor component of claim 1, wherein dopants in the third semiconductor area comprise deep defects, the energy gap of which to a closest band edge is more than 160 meV.

16. The semiconductor component of claim 1, wherein the first conductivity type is n-type.

17. The semiconductor component of claim 16, wherein dopants in the drift zone comprise defects having an energy gap from a conduction band edge of less than 140 meV.

18. The semiconductor component of claim 1, wherein the semiconductor component has a plurality of the second semiconductor areas, wherein a ratio of minimum lateral distance between adjacent ones of the second semiconductor areas and minimum lateral extent of the second semiconductor area is within a range from 0.1 to 20.

19. The semiconductor component of claim 1, wherein a dopant concentration of the fifth semiconductor area is between $5 \times 10^{17}$ cm$^{-3}$ to $5 \times 10^{18}$ cm$^{-3}$.

20. The semiconductor component of claim 1, further comprising a sixth semiconductor area of the first conductivity type between the drift zone and the second semiconductor area, wherein a dopant concentration of the sixth semiconductor area is between $5 \times 10^{17}$ cm$^{-3}$ to $5 \times 10^{18}$ cm$^{-3}$.

* * * * *